US007153442B2

(12) United States Patent
Furuhata et al.

(10) Patent No.: US 7,153,442 B2

(45) Date of Patent: Dec. 26, 2006

(54) METHOD OF MANUFACTURING AN INK JET PRINT HEAD

(75) Inventors: Yutaka Furuhata, Nagano (JP); Yoshinao Miyata, Nagano (JP)

(73) Assignee: Seiko Epson Corporation, Tokyo (JP)

( * ) Notice: Subject to any disclaimer, the term of this patent is extended or adjusted under 35 U.S.C. 154(b) by 90 days.

(21) Appl. No.: 10/915,442

(22) Filed: Aug. 11, 2004

(65) Prior Publication Data

US 2005/0006338 A1 Jan. 13, 2005

Related U.S. Application Data

(62) Division of application No. 09/908,633, filed on Jul. 20, 2001, now Pat. No. 6,789,319, which is a division of application No. 08/954,088, filed on Oct. 20, 1997, now Pat. No. 6,290,341.

(30) Foreign Application Priority Data

Oct. 18, 1996 (JP) ................................ P. 8-297480
Oct. 21, 1996 (JP) ................................ P. 8-297836

(51) Int. Cl.
*B41J 2/04* (2006.01)
*H01L 21/00* (2006.01)

(52) U.S. Cl. ................................ 216/27; 216/2; 216/41; 29/890.01; 347/65; 347/68; 347/70

(58) Field of Classification Search .................... 216/2, 216/41, 27; 347/65, 68, 70; 29/890.01
See application file for complete search history.

(56) References Cited

U.S. PATENT DOCUMENTS 4,216,477 A 8/1980 Matsuda et al.
4,516,140 A 5/1985 Durkee et al.
5,131,978 A * 7/1992 O'Neill ......................... 216/2
5,381,171 A 1/1995 Hosono et al.
5,385,635 A 1/1995 O'Neill
5,424,769 A * 6/1995 Sakai et al. ................... 347/70
5,748,214 A 5/1998 Usui et al.
5,872,583 A 2/1999 Yamamoto et al.
5,896,150 A 4/1999 Kobayashi et al.

FOREIGN PATENT DOCUMENTS

| | | |
|---|---|---|
| EP | 0 600 382 | 6/1994 |
| EP | 0652 | 5/1995 |
| EP | 738599 | 10/1996 |
| EP | 0799 700 | 10/1997 |
| JP | 5-78138 | 3/1993 |
| JP | 5-155030 | 6/1993 |
| JP | 5309835 A | 11/1993 |
| JP | 6-31914 | 2/1994 |

(Continued)

*Primary Examiner*—Shamim Ahmed
(74) *Attorney, Agent, or Firm*—Sughrue Mion, PLLC

(57) ABSTRACT

A method of manufacturing an ink jet print head is provided. The method forms, on a silicon monocrystailine substrate, a first etching pattern for forming pressure generating chambers and a second etching pattern located opposite to the first etching pattern with respect to ink supply ports. The second etching pattern is narrower than the first etching pattern and is located within opposite lines defining the first etching pattern. The method also anisotropically etches the silicon monocrystailline from the surface thereof, on which the first and second etching patterns are formed, to the other surface thereof and anisotropically etches areas of the silicon monocrystalline substrate. Also, each of the areas is located between the first and second etching patterns, to a depth suitable for the ink supply ports.

6 Claims, 6 Drawing Sheets

FOREIGN PATENT DOCUMENTS

| | | | |
|---|---|---|---|
| JP | 6055733 | A | 3/1994 |
| JP | 6-183000 | | 7/1994 |
| JP | 6-297701 | | 10/1994 |
| JP | 7-276625 | | 10/1995 |
| JP | 7-276626 | | 10/1995 |
| JP | 8025631 | A | 1/1996 |

* cited by examiner

FIG.2(III)
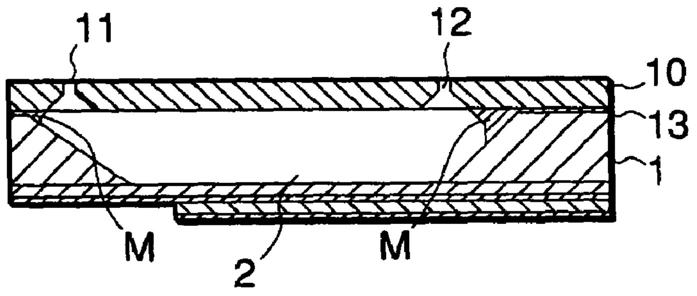

FIG.4(III)
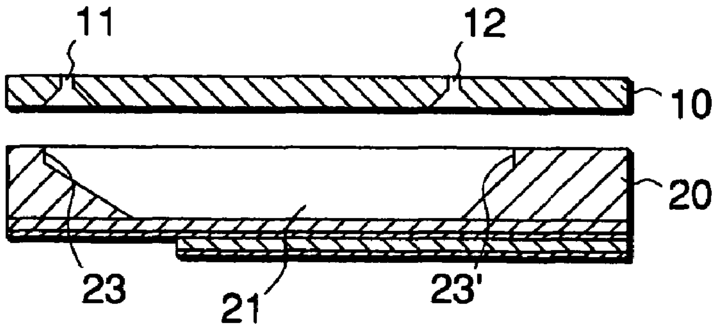

FIG.6(III)
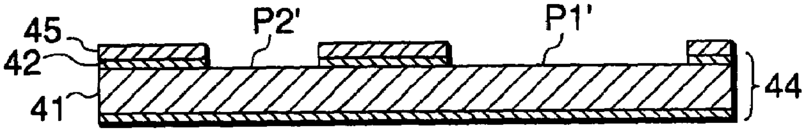
FIG.6(VII)
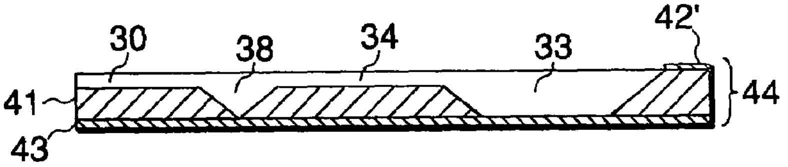
FIG.6(VIII)
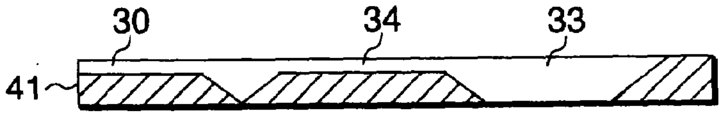

METHOD OF MANUFACTURING AN INK JET PRINT HEAD

This application is a divisional of application Ser. No. 09/908,633, filed Jul. 20, 2001, now U.S. Pat. No. 6,789,319 which is a divisional of application Ser. No. 08/954,088 filed Oct. 20, 1997 now U.S. Pat. No. 6,290,341. Both applications are incorporated herein by reference.

BACKGROUND OF THE INVENTION

1. Field of the Invention

The present invention relates to an ink jet print head which includes a fluid passage forming substrate having pressure generating chambers formed by anisotropically etching a silicon monocrystalline substrate.

2. Related Art Discussion

A conventional ink jet print head is shown in FIG. 9. As shown, the print head has a layered structure which is made up of a fluid passage forming substrate 51, a covering member 55, and an elastic plate 57. The fluid passage forming substrate 51 includes a pressure generating chamber 50 that receives an external pressure. The covering member 55 has a discharge orifice 54 communicating with the pressure generating chamber 50 and an ink supplying port 53 communicatively connecting a reservoir 52 to the pressure generating chamber 50. The elastic plate 57 has a pressure generating means 56 and covers one of the major sides of the fluid passage forming substrate 51. The pressure generating chamber 50 is expanded and contracted by the pressure generating means 56 of the elastic plate 57. When expanded, the pressure generating chamber sucks ink from the reservoir 52 through the ink supplying port 53. When contracted, the pressure generating chamber causes the sucked ink to eject outside in the form of ink droplets through the discharge orifice 54.

In forming the fluid passage forming substrate 51 having the pressure generating chambers 50 formed therein, an etching pattern corresponding to an array of pressure generating chambers is formed on a silicon monocrystalline substrate having a face (110). Then, the structure is etched in an alkaline water solution containing potassium hydroxide by an anisotropical etching process. In the process of anisotropically etching the silicon monocrystalline substrate, recesses and openings having (111) faces that are vertical to the (110) face are linearly formed. The recesses and the openings are considerably high in their aspect ratio. The result is the formation of pressure generating chambers arrayed at extremely high density.

In the silicon monocrystalline substrate having a (110) face, (111) faces appear, which are each slanted at about 35° with respect to the surface of the silicon monocrystalline substrate, and extended from the intersection of linear patterns along the (111) faces vertical to the (110) faces. These faces (111) form the walls 58 and 58' of each pressure generating chamber 50.

With the formation of the slanted walls, acutely angled spaces 59 and 59' are formed in the vicinity of discharge orifices 54 and ink supplying ports 53. In the spaces, ink stagnates and air bubbles stay there. The air bubbles staying there are hard to remove.

SUMMARY OF THE INVENTION

According to the present invention, there is provided an ink jet print head comprising: a fluid passage forming substrate including pressure generating chambers being trapezoidal in shape, which are formed by etching a silicon monocrystalline substrate by anisotropical etching process, each pressure generating chamber having first walls, which are vertical to the surface of the silicon monocrystalline substrate and oriented in the orientation of the pressure generating chambers, and second walls which are slanted at an angle of 35° with respect to the surface of the silicon monocrystalline substrate, the second walls being formed at both ends of each pressure generating chamber; an elastic plate firmly fastened onto first opening-formed sides of the pressure generating chambers, pressure generating means for expanding and contracting the pressure generating chambers being mounted on the surface of the elastic plate, and a covering member having nozzle openings each located at the end of each pressure generating chamber and firmly fastened to second opening-formed sides of the pressure generating chambers, the opening of the first opening-formed side being smaller than the opening of the second opening-formed side; wherein the covering member is firmly fastened on the fluid passage forming substrate by adhesive, and meniscuses of the adhesive are formed and hardened in spaces defined by walls slanted at an angle of 35° with respect to the surface of the fluid passage forming substrate in which the nozzle openings are formed. The acutely angled spaces are filled with the adhesive walls 15. Each pressure generating chamber has walls substantially parallel to the flowing direction of ink. No stagnation of ink is present in the pressure generating chambers. Accordingly, an object of the present invention is to provide an ink jet print head in which stagnation of ink is removed in the vicinity of nozzle openings and ink supply ports, to thereby eliminate air bubbles staying there, and hence the removability of bubbles is improved.

Another object of the present invention is to provide a method of manufacturing an ink jet print head improved as mentioned above.

Yet another object of the present invention is to provide a method of manufacturing a fluid passage forming substrate for an ink jet print head in which the width of the ink supply ports is not expanded even if the etching patterns are shifted from their correct positions, and the ink supply ports have accurate flow resistance values.

DESCRIPTION OF THE PREFERRED EMBODIMENTS

Figure 1A:
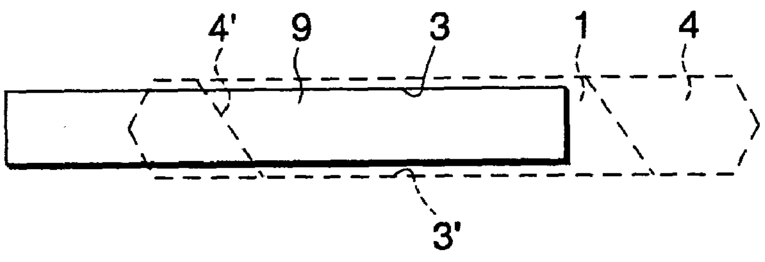
FIGS. 1(*a*) and 1(*b*) are top and sectional views showing an embodiment of an ink jet print head according to the present invention, these views showing typically a single pressure generating chamber and its near structure.
Figure 1B:
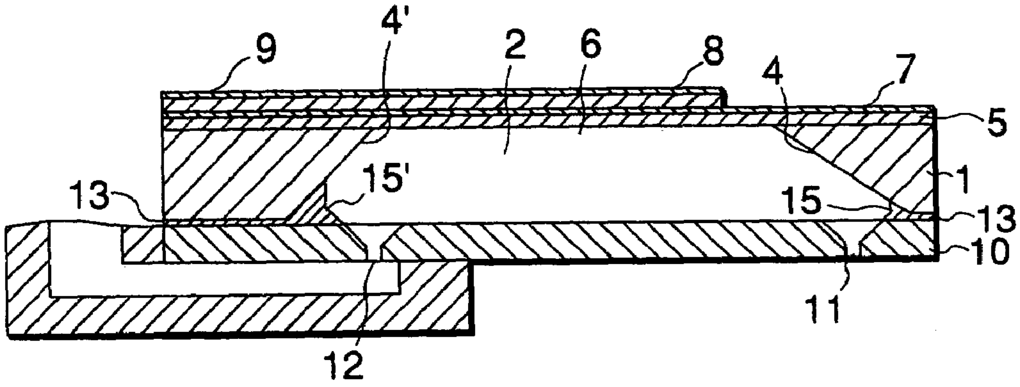

Reference is made to FIGS. 1(*a*) and 1(*b*) showing an embodiment of the present invention. A fluid passage forming substrate 1 having pressure generating chambers formed therein is formed with a silicon monocrystalline substrate processed by anisotropical etching process. The surfaces of the lengthwise sides of each pressure generating chamber 2 is defined by opposite walls 3 and 3' vertical to the silicon monocrystalline substrate. Both ends of the pressure generating chamber 2 are defined by walls 4 and 4', which appear while being slanted at approximately 35° with respect to the surface of the silicon monocrystalline substrate of the silicon monocrystalline substrate.

An elastic film 5 is an elastically deformable thin film made of, for example, zirconia oxide, which is fastened on a narrow opening surface 6 of the silicon monocrystalline substrate 1. A lower electrode 7 as a common electrode is formed on the surface of the elastic film 5. A piezoelectric layer 8 is formed on the lower electrode 7. Upper electrodes 9 are discretely formed on the piezoelectric layer 8 while being arrayed corresponding to and in opposition to the pressure generating chambers 2. In the structure where the upper electrodes 9 are arrayed in opposition to the pressure generating chambers 2, if a drive signal is applied to between the lower electrode 7 and a specific or selected upper electrode 9, the pressure generating chamber 2 corresponding to the selected upper electrode 9 is expanded and contracted to eject an ink droplet therefrom.

A covering member 10 is fastened on the surface of the other side of the silicon monocrystalline substrate 1. A nozzle orifice 11 is formed in the covering member 10 at a location closer to one end of the pressure generating chamber 2, and an ink supply port 12 is also formed in the covering member 10 at another location closer to the other end of the pressure generating chamber 2. The wider opening side or surface of the fluid passage forming substrate 1 is coated with adhesive to form a adhesive layer 13 thereon. The covering member 10 is applied, and bonded onto the silicon monocrystalline substrate 1 with the aid of the adhesive layer 13 intervening therebetween.

Figure 2I:
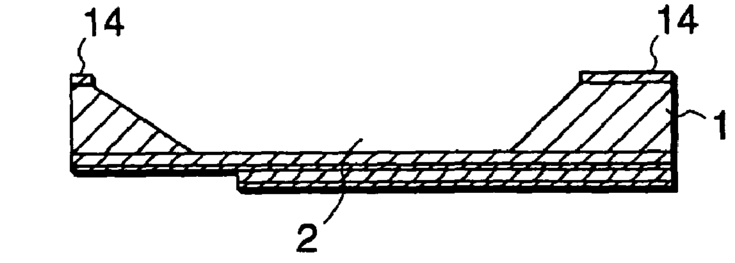
FIGS. 2(I) to 2(III) are sectional views showing a bonding process of a covering member on a fluid passage forming substrate in a method of manufacturing the ink jet print head of FIG. 1.
Figure 2:
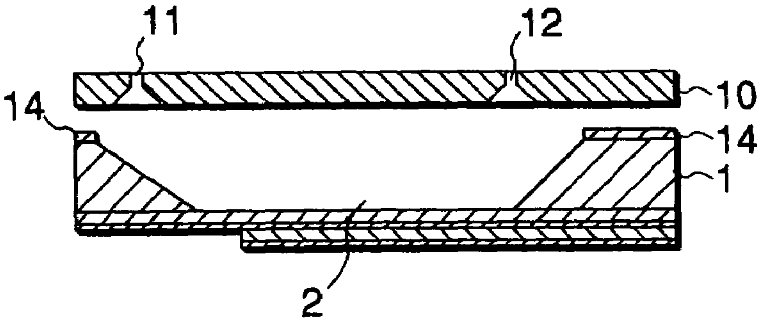

In a bonding process of the covering member on the fluid passage forming substrate, as shown in FIGS. 2(I)–2(III), the fluid passage forming substrate 1 is coated with adhesive 14 (see FIGS. 2(I) and (II)). The nozzle orifices 11 and the ink supply ports 12 of the covering member 10 are aligned with the related pressure generating chambers 2 ((FIG. 2(II)). The covering member 10 and the fluid passage forming substrate 1 are compressed together and the adhesive 14 present therebetween is hardened. In the bonding process, when the covering member and the fluid passage forming substrate are compressed together, part of the adhesive 14 flows out into the pressure generating chamber 2. At this time, the adhesive flows, by its surface tension, into the narrow spaces formed by the walls 4 and 4' defining the ends of the pressure generating chamber 2 and the surface of the covering member 10, whereby meniscuses M are formed therein as shown in FIG. 2(III).

In this state, the adhesive is hardened to form walls 15 and 15' (FIG. 1(*b*)) inclined at a large angle. This angle is much larger than the angle between the covering member 10 and each of the walls 4 and 4'. Therefore, flowing ink does not stagnate in the vicinity of the nozzle orifice 11 and the ink supply port 12. As a result, no bubbles stay at the ends of the pressure generating chamber 2 (when longitudinally viewed), and if staying there, the bubbles may easily be removed.

Figure 3:
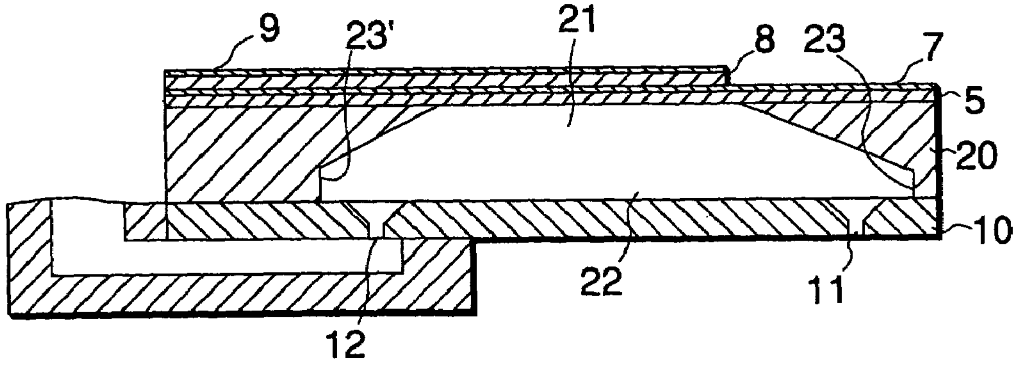
FIG. 3 is a sectional view showing another embodiment of an ink jet print head according to the present invention, the view showing typically a single pressure generating chamber and its near structure.

FIG. 3 shows a second embodiment of the present invention. As shown, to form a fluid passage forming substrate 20, through-holes to be used as pressure generating chambers 21 are formed in a silicon monocrystalline substrate by a crystalline anisotropic etching process. At this time, in each of the formed pressure generating chambers, an enlarged portion 22 is formed which has faces 23 and 23' vertical to the silicon monocrystalline substrate and is opened to the larger opening-formed side of the silicon monocrystalline substrate.

Figure 4I:
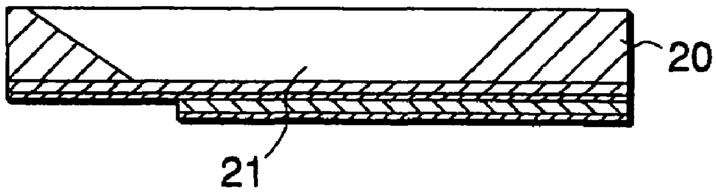
FIGS. 4(I) to 4(III) are sectional views showing a method of manufacturing the ink jet print head of FIG. 3.
Figure 4:
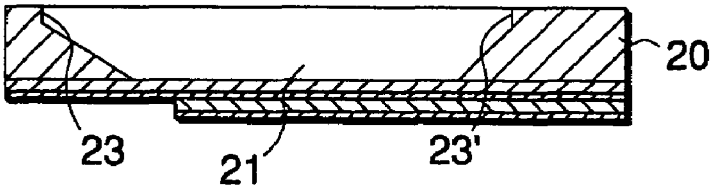

To be more specific, as shown in FIGS. 4(I)–4(III), pressure generating chambers are formed in a silicon monocrystalline substrate by an anisotropic etching process (FIG. 4(I)). The silicon monocrystalline substrate is etched by a surface anistropical etching process, e.g., dry etching process, from the surface of the substrate on which the covering member 10 is to be formed, toward the inner part of the substrate for a preset time (FIG. 4(II)). In the etching process, the exposed surfaces of the silicon monocrystalline substrate are etched at a fixed rate in its depth direction, or the direction vertical to the surface of the fluid passage forming substrate 20. With the progress of the etching, the faces 23 and 23' are formed extending inward from the larger opening-formed side of each pressure generating chamber, onto which the covering member 10 is to be fastened. The nozzle orifices 11 and the ink supply ports 12 of the covering member 10 are aligned with the pressure generating chambers 21 of the silicon monocrystalline substrate, and the covering member 10 is applied to the substrate surface having the enlarged portions 22 (FIG. 3) that are formed therein by surface anisotropical etching process, and bonded to the latter (FIG. 4(III)). Here, an ink jet print head is completed.

In the present embodiment, the vertical faces 23 and 23' which are formed in the vicinity of the nozzle orifice 11 and the ink supply port 12 of each pressure generating chamber by surface anisotropic etching process, are substantially parallel to the flowing direction of ink in the nozzle orifice 11 and the ink supply port 12. Therefore, no stagnation of ink flow is present in the vicinity of the nozzle orifice 11 and the ink supply port 12, and bubbles staying there are easily removed therefrom. Since the faces 23 and 23' for making ink flow smooth are already formed in the vicinity of the nozzle orifice 11 and the ink supply port 12, there is no need for forming the adhesive meniscuses M (FIG. 1(*b*)). Therefore, a bonding method not using adhesive, for example, an anodic bonding method, may be used for bonding the covering member 10 to the fluid passage forming substrate. As a result, no adhesive flows into the pressure generating chamber 2, and there is no chance of clogging the nozzle orifice 11 and the ink supply port 12 with adhesive.

In the above-mentioned embodiment, the ink supply ports are formed in the covering member, and the reservoirs are formed in another member. If required, the reservoirs and the ink supply ports may be formed in the fluid passage forming substrate. In this case, the present invention is applied to the structure of the ink supply ports of the silicon monocrystalline substrate.

Figure 5:
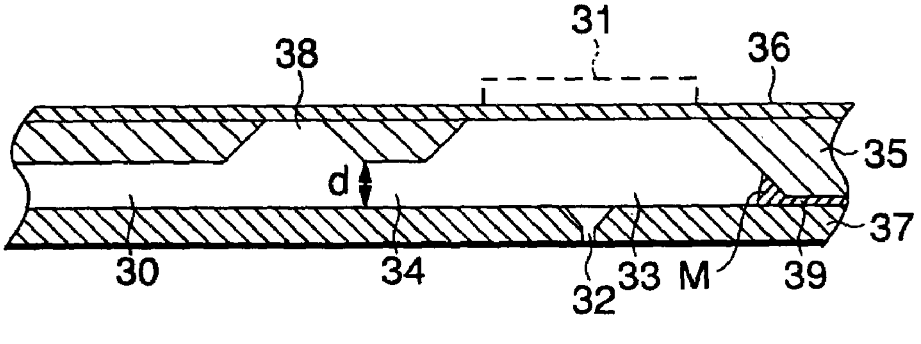
FIG. 5 is a sectional view showing yet another embodiment of an ink jet print head according to the present invention, the print head having a fluid passage forming substrate formed by anisotropically etching a silicon monocrystalline substrate, and the view showing typically a single pressure generating chamber and its near structure.

The present invention may also be embodied as shown in FIG. 5. An ink jet print head of FIG. 5 has a layered structure made up of a fluid passage forming substrate 35, an elastic plate 36 and a nozzle plate 37. A silicon monocrystalline substrate is anisotropically etched to form the fluid passage forming substrate 35 which includes reservoirs 30 for receiving ink from exterior, pressure generating chambers 33 for ejecting ink droplets through nozzle orifices 32 when those are pressed by pressure generating means 31, and ink supply ports 34 for supplying ink from the reservoirs 30 to the pressure generating chambers 33. The elastic plate 36 tightly covers one of the major sides or surfaces of the fluid passage forming substrate. The nozzle plate 37 tightly covers the other major side of the fluid passage forming substrate.

In the fluid passage forming substrate, which is thus formed by anisotropically etching the silicon monocrystalline substrate, each ink supply port 34, which greatly affects the ink ejection performances, functions as an ink guide means for smoothly supplying ink from the reservoir 30 to the pressure generating chamber 33, and provides flow resistance for ejecting the ink, when is pressed in the pressure generating chamber 33, through the nozzle orifice 32 in the form of an ink droplet. From those functions, it will be confirmed that the ink supply port 34 is one of the factors that greatly affects the ink ejecting performances.

If the width of the ink supply port 34 is selected to be substantially equal to that of the pressure generating chamber 33 and the depth d of the ink supply port is selected to be shallow, the ink supply port 34 has a flow resistance value comparable with that of the nozzle orifice 32.

Figure 10A:
FIG.10(a) CONVENTIONAL ART
FIGS. 10(*a*) and 10(*b*) are views showing conventional etching patterns used for forming the fluid passage forming substrate shown in FIG. 5, and an ink supply port formed by use of that etching pattern.
Figure 10B:
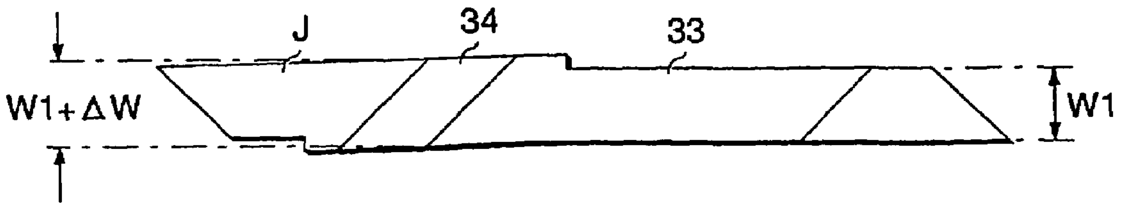
FIG.10(b) CONVENTIONAL ART

To form the ink supply port 34, as shown in FIG. 10(*a*), one side of an area to be used as the ink supply port 34 is etched by use of an etching pattern P3 of the pressure generating chamber 33, while the other side of the area is etched by use of an etching pattern P4 of the width W1 that is equal to that of the pressure generating chamber 33. Then, an area between those patterns P3 and P4 is half etched to form a recess of the width W1 there. This recess is used for the ink supply port 34.

If one of those two patterns, e.g., the pattern P3 for forming a passing hole 38, is shifted from the other pattern P4 by ΔL, as indicated by a dotted line, the width for the ink supply port 34 expands to positions where lines prolonged from the etching pattern P3 for the pressure generating chamber 33 and the etching pattern P4 contact with each other. The width of the ink supply port 34 is expanded by a slight amount ΔW to have the width (W1+ΔW). As a result, a flow resistance of the ink supply port 34 varies. The variation of the flow resistance leads to a variation of the ink drop ejection performances, and degradation of the print quality.

Figure 6I:
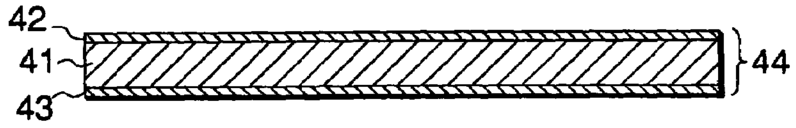
FIGS. 6(I) to 6(VIII) are sectional views showing a method of manufacturing a fluid passage forming substrate for the ink jet print head of FIG. 5.
Figure 6:
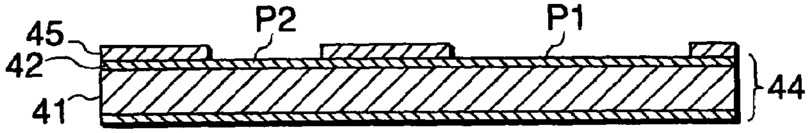
Figure 6:
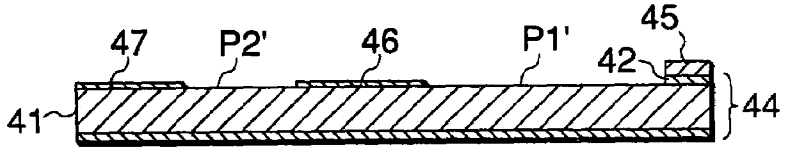
Figure 6V:
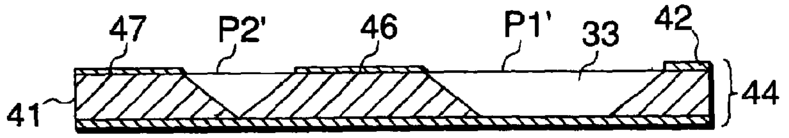
Figure 6:
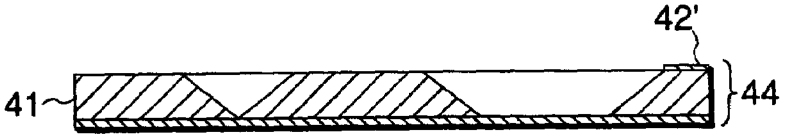

FIG. 6 shows a set of sectional views showing a method of manufacturing the fluid passage forming substrate shown in FIG. 5. A silicon monocrystalline substrate 41 that is cut so as to have the surfaces each of a (110) face is thermally oxidized to form a base material 44 having $SiO_2$ layers 42 and 43 layered over the entire surfaces thereof (I in FIG. 6). The $SiO_2$ layers 42 and 43 serve also as etching protecting films in an etching process of the silicon monocrystalline substrate 41.

Figure 7:
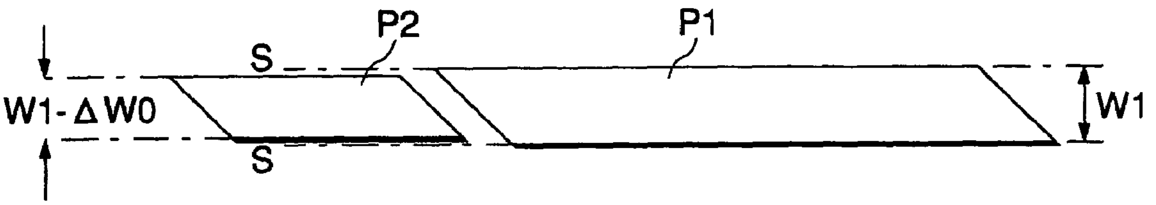
FIG. 7 is a view showing an example of an etching pattern, which is used for forming a fluid passage forming substrate by use of a silicon monocrystalline substrate.

A photo resist 45 is formed on the $SiO_2$ layer 42 so that the orientation of the pressure generating chambers 33 is coincident with the crystal orientation (112). As a result, a first etching pattern P1 of the width W1 for the pressure generating chambers 33 and a second etching pattern P2 to be used as a passing hole 38 (the area for the ink supply port 34 is located between the patterns P1 and P2) are formed, as shown in FIG. 7. The second etching pattern P2 is narrower than the first etching pattern P1 (W2<W1; W2=width of the pattern P2, and W1=width of the pattern P1), and is formed within the opposite lines S and S defining the first etching pattern P1 (11 in FIG. 6).

The $SiO_2$ layer 42 is removed by use of the buffer hydrofluoric acid solution consisting of hydrofluoric acid and ammonium fluoride at a rate of 1:6, to thereby form window patterns P1' and P2' for anisotropic etching processes, which are coincident in shape with the etching patterns P1 and P2 (III). The photo resist 45 on the $SiO_2$ layer at positions where the ink supply ports 34 and the reservoirs 30 are to be formed is removed again, and $SiO_2$ layers 46 and 47 are etched in the previously described buffer hydrofluoric acid solution for about 5 (five) minutes till its thickness is reduced to be approximately 0.5 μm (IV). After the removal of the photo resist 45, the base material 44 is anisotropically etched in a 10% potassium hydroxide solution heated to a temperature at 80° C. The etching progresses and reaches the other side $SiO_2$ layer 43, so that recesses corresponding to the patterns P1' and P2' which are to be the pressure generating chambers 33 and the passing holes 38 are formed. The layers $SiO_2$ layers 42, 46 and 47, which serve as etching protecting films, are also etched away. The $SiO_2$ layers 46 and 47 on the areas for the ink supply ports 34 and the reservoirs 30 are left as layers being thinned to be about 0.2 μm, and the $SiO_2$ layers 42 are left as layers being thinned to be about 0.6 μm (V in FIG. 6).

Figure 8:
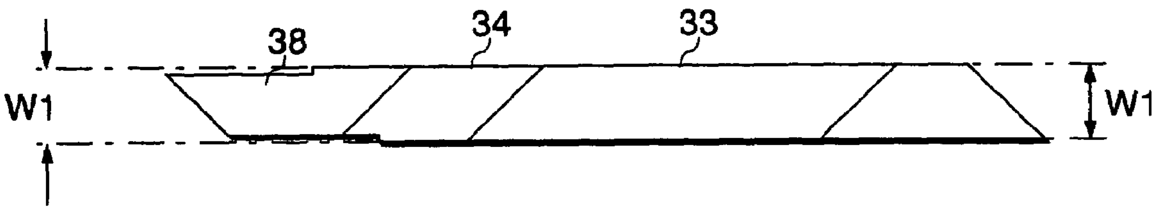
FIG. 8 is a view showing the result of anisotropically etching the silicon monocrystalline substrate by use of the etching pattern shown in FIG. 7.
Figure 9:
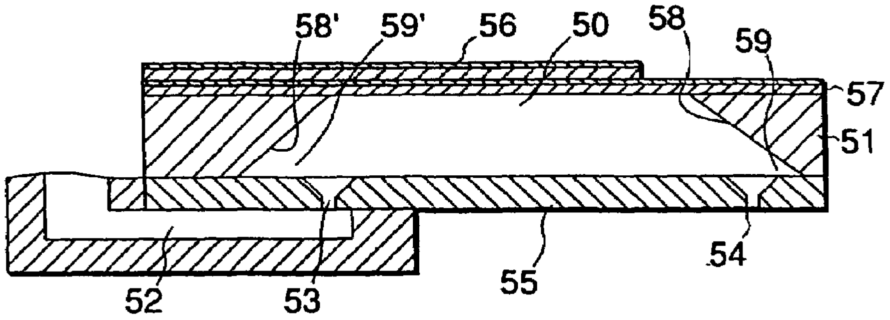
FIG.9 CONVENTIONAL ART
FIG. 9 is a sectional view showing a conventional ink jet print head which uses a fluid passage forming substrate constructed with a silicon monocrystalline substrate, the view showing typically a single pressure generating chamber and its near structure.

The base material 44 is immersed into the buffer hydrofluoric acid solution for such a time period as to allow the removal of the $SiO_2$ layers of 0.1 μm, for example, about one minute. The result is to remove the $SiO_2$ layers 46 and 47 on the areas in which the ink supply ports 34 and the reservoir 30 are to be formed, and to leave the $SiO_2$ layers 46 on the remaining areas in the form of layers 42, of about 0.1 μm (VI in FIG. 6). The base material 44 is immersed again into an about 40% potassium hydroxide solution for anisotropical etching process, whereby the areas of the ink supply ports 34 and the reservoirs 30 are selectively etched again (VII in FIG. 6). As recalled, the second etching pattern P2 is located within the boundary lines S and S of the first etching pattern P1'. Therefore, the etching process for the areas to be the ink supply ports 34 stops at the positions of the outermost lines, viz., the lines defining the width W1 of the first etching pattern P1. If a shift of the first etching pattern P1 relative to the second etching pattern P2, and the second etching pattern P2, as well, is within the area between the boundary lines S and S, the ink supply port 34 is formed having the width equal to the width W1 of the pressure generating chamber 33, as shown in FIG. 8.

Therefore, if an etching quantity in the second etching process, or the half etching process, is controlled in terms of the etching time, the ink supply ports of desired flow resistance values are formed. If the width of each passing hole 38 located between the ink supply port 34 and the reservoir 30 is somewhat narrow, the narrowness of the passing hole does not give rise to such a variation of the flow resistance as to ink ejecting performances since the passing hole 38 is deeper than the ink supply port 34. Finally, the residual $SiO_2$ layers 42' and 43 are removed by use of the buffer hydrofluoric acid solution, to complete the fluid passage forming substrate (VIII in FIG. 6). Subsequently, the surface of the fluid passage forming substrate is coated with the adhesive 39, and the nozzle plate 37 is applied to the adhesive coated surface of the fluid passage forming substrate, and fastened thereonto, and meniscuses M are automatically formed at the acutely angled portions of the fluid passage forming substrate. The result is that no bubbles remain there and improvement in removability of the bubbles.

If it happens that the first etching pattern P1 is narrower than the second etching pattern P2 and put within the second etching pattern P2, the width of each ink supply port 34 can be controlled to a desired width. In a case where this structure is employed, however, a shape of each pressure generating chamber 33 to be formed by the first etching pattern P1 varies, and a factor varies which more greatly affects the ink ejecting performances, e.g., compliance, than the flow resistance of the ink supply port 34. For this reason, use of this structure is not suggested.

While particular embodiments of the invention have been shown and described, it will be obvious to one skilled in the art that changes and modifications can be made without departing from the spirit and scope of the invention as defined in the appended claims.

What is claimed is:

1. A method of manufacturing an ink jet print head comprising:

a first step for forming on a silicon monocrystailine substrate a first etching pattern to be pressure generating chambers and a second etching pattern located in opposition to said first etching pattern with respect to ink supply ports, said second etching pattern being narrower than said first etching pattern and located within opposite lines defining said first etching pattern;

a second step for anisotropically etching said silicon monocrystailline substrate from a first face thereof on which said first and second etching patterns are formed to a second face thereof, wherein the second face is opposite to the first face; and a third step for anisotropically etching areas of said silicon monocrystalline substrate, each of the etching areas being located between said first and second etching patterns, to a depth suitable for said ink supply ports.

2. The method of manufacturing an ink jet print head according to claim 1, in which in said third step, reservoirs are also formed.

3. The method of manufacturing an ink jet print head according to claim 1, further comprising:

a step for providing a nozzle plate on said silicon monocrystalline substrate; and a step for providing a pressure generating element on said silicon monocrystalline substrate, wherein the ink supply ports and the pressure generating chambers are formed on said silicon monocrystalline substrate; and wherein the pressure generating chambers are formed so as to correspond in number to the ink supply ports.

4. A method of manufacturing at least a portion of an ink jet print head comprising:

forming a first etching pattern on a substrate, wherein the first etching pattern corresponds to pressure generating chambers;

forming a second etching pattern on said substrate, wherein said second etching pattern is narrower than said first etching pattern and located within opposite lines defining said first etching pattern;

etching said substrate from a first face on which said first and second etching patterns are formed towards a second face, wherein the second face is opposite to the first face; and etching areas of said substrate to a depth suitable for ink supply ports, wherein said areas are located between said first and second etching patterns.

5. The method according to claim 4, further comprising forming reservoirs when said areas are etched.

6. The method according to claim 4, wherein the pressure generating chambers correspond in number to the ink supply ports.

* * * * *